US012360140B2

(12) United States Patent
Nag et al.

(10) Patent No.: US 12,360,140 B2
(45) Date of Patent: Jul. 15, 2025

(54) CURRENT SENSING CIRCUITRY

(71) Applicant: Cirrus Logic International Semiconductor Ltd., Edinburgh (GB)

(72) Inventors: Dipankar Nag, Newbury (GB); Peter Hsu, Edinburgh (GB); Kapil R. Sharma, Edinburgh (GB); Gordon J. Bates, Edinburgh (GB); Simon R. Foster, Reading (GB); Mark J. McCloy-Stevens, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/484,873

(22) Filed: Oct. 11, 2023

(65) Prior Publication Data
US 2024/0044954 A1 Feb. 8, 2024

Related U.S. Application Data

(63) Continuation of application No. 17/129,113, filed on Dec. 21, 2020, now Pat. No. 11,835,554.
(Continued)

(51) Int. Cl.
*G01R 19/25* (2006.01)
*H03F 3/45* (2006.01)
*G01R 19/00* (2006.01)

(52) U.S. Cl.
CPC ..... *G01R 19/2509* (2013.01); *H03F 3/45475* (2013.01); *G01R 19/0053* (2013.01);
(Continued)

(58) Field of Classification Search
CPC .......... G01R 19/2509; G01R 19/25; G01R 19/0053; G01R 19/0092; G01R 19/2506;
(Continued)

(56) References Cited

U.S. PATENT DOCUMENTS 6,927,717 B1 * 8/2005 Oprescu ................. H03M 3/34
341/143
10,209,827 B1 * 2/2019 Malkin ................ G06F 3/0418
(Continued)

FOREIGN PATENT DOCUMENTS

CN 101044684 A 9/2007
CN 102680919 A 9/2012
(Continued)

OTHER PUBLICATIONS

Combined Search and Examination Report under Sections 17 and 18(3), UKIPO, Application No. GB2100814.9, dated Sep. 30, 2021.
(Continued)

*Primary Examiner* — Dominic E Hawkins
(74) *Attorney, Agent, or Firm* — Jackson Walker L.L.P.

(57) ABSTRACT

The present application relates to current sensing circuitry (100) that comprises a differential amplifier (110) comprising first and second inputs configured to sense a current across a sense resistance, and an output configured to output a current sense signal. The circuitry (100) further comprises a first current source, a second current source and a switch network operable in: a first phase in which the first current source is connected to the first input and disconnected from the output, and the second current source is connected to the output and disconnected from the first input; and a second phase in which the first current source is connected to the output and disconnected from the first input, and the second current source is connected to the first input and disconnected from the output.

20 Claims, 9 Drawing Sheets

Related U.S. Application Data

(60) Provisional application No. 63/014,303, filed on Apr. 23, 2020.

(52) U.S. Cl.
CPC .. *H03F 2200/129* (2013.01); *H03F 2200/171* (2013.01); *H03F 2203/45116* (2013.01)

(58) Field of Classification Search
CPC ........... H03F 3/45475; H03F 2299/129; H03F 2299/171; H03F 2299/45116
See application file for complete search history.

(56) References Cited

U.S. PATENT DOCUMENTS

| | | |
|---|---|---|
| 2006/0197578 A1 | 9/2006 | Nuebling |
| 2008/0018510 A1 | 1/2008 | Huang |
| 2013/0134963 A1* | 5/2013 | Introwicz ................ G01R 1/30 |
| | | 324/123 R |
| 2013/0271216 A1 | 10/2013 | Liu et al. |
| 2015/0054576 A1 | 2/2015 | Zhou et al. |
| 2015/0295660 A1* | 10/2015 | Suzuki ................ H03F 3/45085 |
| | | 398/208 |
| 2016/0173041 A1* | 6/2016 | Prasad ................ H03F 3/45475 |
| | | 330/9 |
| 2016/0305988 A1* | 10/2016 | Stack ................... G01R 19/257 |
| 2016/0306061 A1* | 10/2016 | Lamesch ................ G01D 5/24 |
| 2018/0323762 A1 | 11/2018 | Motoroiu et al. |
| 2019/0158026 A1 | 5/2019 | Balasingam et al. |
| 2021/0318380 A1 | 10/2021 | Liao et al. |

FOREIGN PATENT DOCUMENTS

| | | | |
|---|---|---|---|
| CN | 104414631 A | 3/2015 | |
| CN | 204376837 U | 6/2015 | |
| CN | 104991115 A | 10/2015 | |
| CN | 109564249 A | 4/2019 | |
| CN | 110380697 A | 10/2019 | |
| WO | WO-2022015533 A2 * | 1/2022 | ............. G01R 21/10 |

OTHER PUBLICATIONS

First Office Action, China National Intellectual Property Administration, Application No. 2021104377755, issued Jan. 30, 2024.
Search Report, China National Intellectual Property Administration, Application No. 2021104377755, issued Jan. 27, 2024.
Second Office Action, China National Intellectual Property Administration, Application No. 2021104377755, issued Jul. 12, 2024.

* cited by examiner

CURRENT SENSING CIRCUITRY

The present disclosure is a continuation of U.S. Non-Provisional patent application Ser. No. 17/129,113, filed Dec. 21, 2020, which claims priority to U.S. Provisional Patent Application No. 63/014,303, filed Apr. 23, 2020, each of which is incorporated by reference herein in its entirety.

TECHNICAL FIELD

The present application relates to apparatus and methods for current sensing circuitry and, in particular, to current sensing circuitry having an amplifier.

BACKGROUND

Current sensing and accurate current measurement forms a fundamental part of many electronic systems. In particular, current sensing is an important feature in consumer electronic devices, which may include, for example, mobile phones, laptops, tablet computers, smartwatches and desktop PCs. Current measurement may be used for safety reasons, for example, to monitor a current through a load e.g. a light source, such as an LED or an audio load, such as a pair of headphones, to ensure that the current through the load does not exceed a rated threshold. Current measurement may also be used in power management applications. Power management is often of particular importance in portable electronic devices with an on-board power source, such as a battery, where the current drawn from the power source may be monitored to, for example, determine how to distribute power in a portable electronic device.

Various techniques exist for sensing and measuring current in electronic systems. Typically, in consumer electronic devices, two input terminals of an operational amplifier are connected across a sense resistor, which is connected in series with a load. The voltage drop across the sense resistor is then measured to determine the current through the resistor and thus the current being applied to the load. Techniques used for determining the current with such an architecture, can fall into various categories. Low side current measuring, for example, measures the current in the ground return path of the connection to the load. Another example is high side current measuring which measures the current in the supply path of the connection to the load. A further example is full-range current measuring, which effectively involves high and low side current measuring where a bidirectional current is measured in a bridge driven load.

Various advantages and disadvantages are associated with different current sensing techniques. The chosen technique is generally determined by magnitude of the current to be sensed, accuracy of sensing, bandwidth and robustness of the technique. Due to the importance of current sensing in many modern electronic systems, most implemented current sensing techniques generally exhibit properties of high sensitivity, high accuracy, high linearity, wide bandwidth, low temperature drift and strong common mode rejection.

Despite the wide variety of current sensing techniques that can exhibit the properties outlined above, improvements to the field of current sensing and current measurement are desired.

SUMMARY

According to a first aspect there is provided current sensing circuitry that comprises a differential amplifier comprising first and second inputs configured to sense a current across a sense resistance, and an output configured to output a current sense signal. The circuitry further comprises a first current source, a second current source and a switch network operable in: a first phase in which the first current source is connected to the first input and disconnected from the output, and the second current source is connected to the output and disconnected from the first input; and a second phase in which the first current source is connected to the output and disconnected from the first input, and the second current source is connected to the first input and disconnected from the output.

In some examples, the differential amplifier may comprise a differential chopper amplifier. In such examples, the differential chopper amplifier may be configured to be chopped between a first chopping configuration and a second chopping configuration at a first chopping frequency and said switch network may be operable to chop between the first phase and the second phase at a second chopping frequency.

In some examples, the first chopping frequency and the second chopping frequency may be the same frequency as one another. In some examples, the first chopping frequency and the second chopping frequency may be derived from a common clock signal. In some examples, the first chopping frequency and the second chopping frequency may be synchronous and separated by a delay.

In some examples, the first current source and the second current source may be configured to generate equal bias currents to one another.

In some examples, the differential amplifier may comprise a differential-to-single-ended amplifier.

In some examples the current sensing circuitry may be implemented as an integrated circuit.

According to a second aspect there is provided current sensing circuitry that comprises a first stage that comprises a differential amplifier comprising first and second inputs configured to sense a current across a sense resistance, and, an output configured to output an output current signal. The first stage further comprises first and second current sources and a current source chopper comprising a switch network operable to chop the first and second current sources between the first input and the output. The circuitry also comprises a second stage that comprises a current-to-voltage converter configured to receive the measurement current and output a voltage signal representative of the current across the sense resistance. The circuitry further comprises a third stage that comprises an analogue-to-digital converter (ADC) configured to convert the voltage signal to a digital output voltage signal.

In some examples the current-to-voltage converter may comprise a trans-impedance amplifier (TIA). In some examples the TIA may comprise an anti-aliasing filter.

In some examples the ADC may be configured to receive a first reference voltage to drive the ADC. The TIA may comprise a first TIA input configured to receive the measurement current and a second TIA input configured to receive a second reference voltage derived from the first reference voltage.

In some examples the circuitry may further comprise a low-pass filter and wherein the current source chopper is operable to chop the first and second current sources between the first input and the output at a chopping frequency and a cut-off frequency of the filter is less than the chopping frequency of the current source chopper. In some examples the ADC may comprise the low-pass filter.

In some examples, the differential amplifier may comprise a differential chopper amplifier.

In some examples, the differential chopper amplifier may be operable to repeatedly swap between a first chopper configuration and a second chopper configuration at a first chopping frequency. The current source chopper may be operable to chop the first and second level shifting current sources between the first input and the output based at a second chopping frequency and the first chopping frequency and the second chopping frequency may be configured to be at the same frequency as one another. In some examples, the first chopping frequency and the second chopping frequency have a predetermined relationship to a sampling frequency of the ADC.

In some examples the differential amplifier may comprise a differential-to-single-ended amplifier.

According to a third aspect there is provided current sensing circuitry that comprises a differential-to-single-ended amplifier configured to sense a current across a sense resistance and output a current sense signal. The current sensing circuitry further comprises first and second current sources configured to provide level shifting at an input of the differential-to-single-ended amplifier and at an output of the differential-to-single-ended amplifier, wherein the first and second current sources are chopped between the input of the differential-to-single-ended amplifier and the output of the differential-to-single-ended amplifier.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

The description below further describes example embodiments according to this disclosure applied to circuitry for current sensing. As one skilled in the art would understand, current sensing may also encompass current measuring and/or current monitoring depending on the application to which current sensing, according to example embodiments of the present disclosure, is applied.

Figure 1:
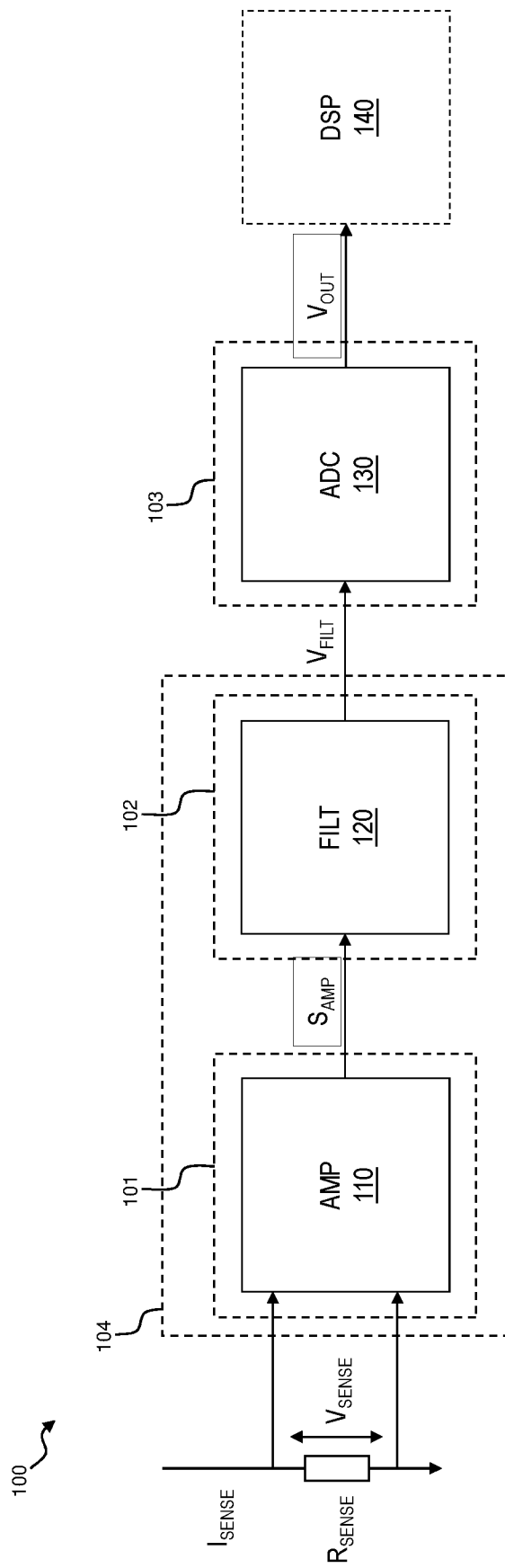
FIG. 1 illustrates an example of current sensing circuitry.

FIG. 1 illustrates a schematic example of current sensing circuitry 100. Current sensing circuitry 100 is configured to sense a current $I_{SENSE}$ through a sense resistance $R_{SENSE}$. In some examples, the sense resistance $R_{SENSE}$ may comprise a resistor, such as a shunt resistor, configured to induce a voltage drop across the resistor to provide a sense voltage $V_{SENSE}$. In some examples, the sense resistance $R_{SENSE}$ may comprise any component that provides a suitable resistance in use in order to induce a voltage drop across the component to provide the sense voltage $V_{SENSE}$, e.g. a transistor with a defined on-resistance.

Circuitry 100 further comprises amplifier circuitry 110, at a first stage 101 of circuitry 100. Amplifier circuitry 110 is configured to measure the sense voltage $V_{SENSE}$ across sense resistance $R_{SENSE}$ and output current sense signal $S_{AMP}$ representative of the sense current $I_{SENSE}$ based on the sense voltage $V_{SENSE}$. In some examples, current sense signal $S_{AMP}$ may comprise a voltage. In some examples, current sense signal $S_{AMP}$ may comprise a current.

Circuitry 100 further comprises filter circuitry (FILT) 120, at a second stage 102 of circuitry 100. Filter circuitry 120 is configured to receive the current sense signal $S_{AMP}$ and output a filtered signal $V_{FILT}$. Filter circuitry 120 may therefore implement anti-aliasing filtering of current sense signal $S_{AMP}$. In some examples, filter circuitry 120 may comprise a current-to-voltage converter configured to convert a current output by amplifier circuitry 110 to a voltage.

The first stage 101 of circuitry 100 comprising amplifier circuitry 110 and second stage 102 of circuitry 100 comprising filter circuitry 120 may be referred to as an analogue front end (AFE) 104. AFE 104 is thus configured to sense the voltage $V_{SENSE}$ across sense resistance $R_{SENSE}$ and output current sense signal $S_{AMP}$ representative of the sense current $I_{SENSE}$ through sense resistance $R_{SENSE}$.

Circuitry 100 further comprises analogue-to-digital converter (ADC) 130 at a third stage 103 of circuitry 100. ADC 130 is configured to receive filtered signal $V_{FILT}$ and convert filtered signal $V_{FILT}$ to a digital output voltage $V_{OUT}$, which may thus comprise a digital representation of the sense current $I_{SENSE}$. In some examples, digital output voltage $V_{OUT}$ may comprise a digital signal N-bits wide, representative of the sense current $I_{SENSE}$. Digital output voltage $V_{OUT}$ may be transmitted to downstream digital signal processing circuitry (DSP) 140 for further processing.

Figure 2:
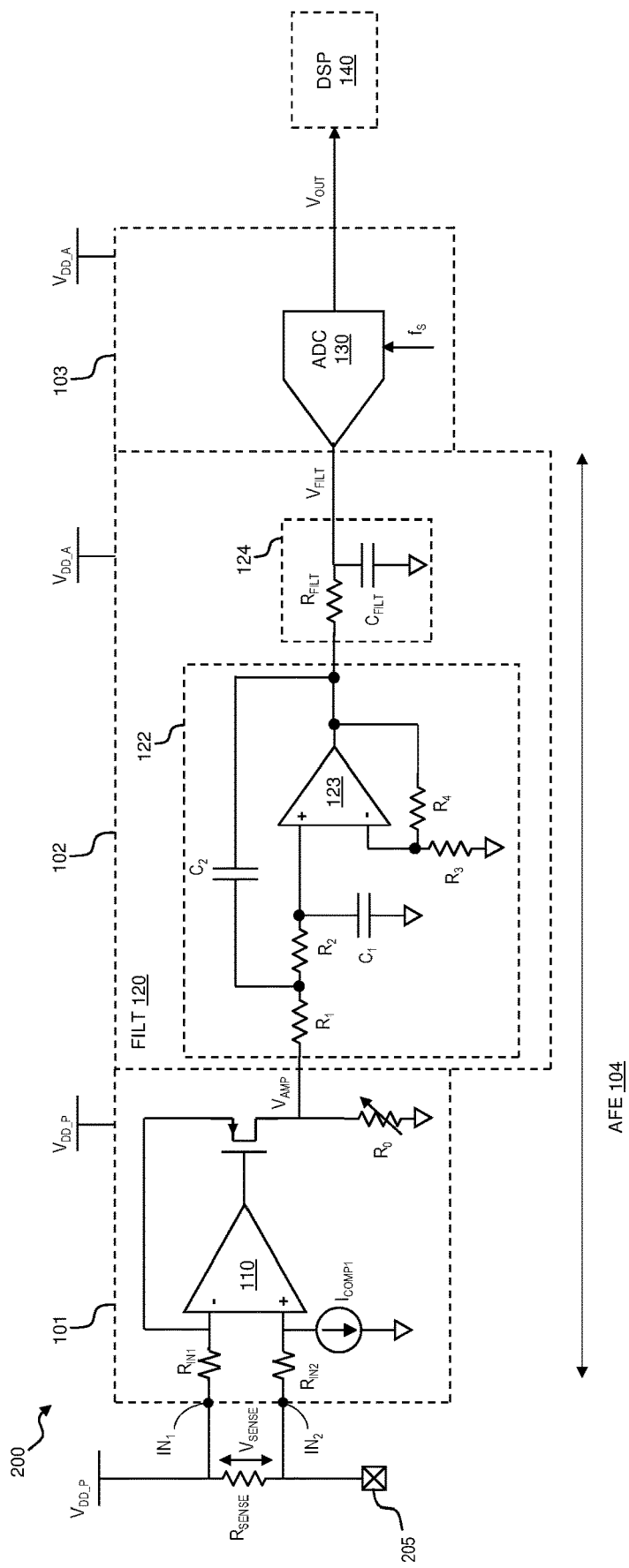
FIG. 2 illustrates another example of current sensing circuitry.

FIG. 2 is a further example of current sensing circuitry 200 which illustrates one example of how current sensing circuitry 100, described above, may be realised. Circuit 200 includes a number of elements in common with circuit 100 described above with reference to FIG. 1. Such common elements are denoted by common reference numerals.

Circuitry 200 comprises a first stage 101 comprising differential-to-single ended amplifier 110. Amplifier 110 comprises a first input $IN_1$ and a second input $IN_2$ coupled to respective input resistors $R_{IN1}$, $R_{IN2}$. First and second inputs $IN_1$, $IN_2$ are configured to sense a current $I_L$ across sense resistor $R_{SENSE}$ based on the voltage drop across sense resistor $R_{SENSE}$. Sense resistor $R_{SENSE}$ is connected in series between a first supply voltage $V_{DDP}$ and a terminal 205, which may comprise a connection to a load. In some examples, the load may comprise a transducer including, for example, a light source, such as an LED, an audio load such as a pair of headphones or a haptic transducer such as a force sensor. In other examples, the load may comprise a component of an integrated circuit to determine the current drawn by the component. FIG. 2 illustrates that the sense resistor $R_{SENSE}$ is connected upstream of terminal 205 providing connection to a load and thus the topology of circuit 200 is that of a high side current sensing topology. However, it will be appreciated that embodiments of the present disclosure may also be implemented in a low side current sensing topology or a full-range current sensing topology.

Referring again to FIG. 2, first stage 101 further comprises a first level-shifting current source $I_{COMP1}$ connected to the non-inverting second input $IN_2$ of amplifier 110. First level-shifting current source $I_{COMP1}$ provides a defined current at the second input so as to provide level-shifting of the voltage sense signal at the input, as would be understood by one skilled in the art. For the purposes of the present disclosure, a current source may also be referred to as a current sink and vice versa e.g. first level-shifting current source $I_{COMP1}$ may also be referred to as a first level-shifting current sink. Also, in this example, first stage 101 further comprises level-shifting variable resistor $R_0$ connected to the output of amplifier 110 to provide level-shifting of the amplifier output to second stage 102. Second stage 102 may be powered by second supply voltage $V_{DDA}$, which may be 1.8V.

As described above in relation to FIG. 1, amplifier circuitry 110 is configured to output an amplifier output signal $S_{AMP}$, which may comprise a current or a voltage, to second stage 102. In the example of FIG. 2, variable resistor $R_0$ is configured to convert the current output by amplifier 110 to an amplifier output voltage $V_{AMP}$, such that the amplifier output signal $S_{AMP}$ comprises a voltage output to second stage 102.

First level-shifting current source $I_{COMP1}$ may also provide loop stability at all source current conditions. For example, if no current is flowing through sense resistor $R_{SENSE}$, first level-shifting current source $I_{COMP1}$ may thus provide some input current to ensure that the amplifier 110 does not become unstable. This is advantageous in allowing the current sensing circuitry 200 to sense current in applications where the current being sensed may, at times, be zero.

Referring again to FIG. 2, second stage 102 comprises filter circuitry 120 comprising low-pass filter 122 and RC filter 124. Low-pass filter 122 comprises an op-amp 123, first to fourth resistors $R_{1-4}$ and first and second capacitors $C_1$, $C_2$ configured in a Sallen-key topology. Filter 122 is configured to implement low-pass filtering of the amplifier output voltage $V_{AMP}$ and acts as a buffer for ADC 130. Filter 122 further provides anti-aliasing filtering of the amplifier output voltage $V_{AMP}$, as described in more detail below. RC filter 124 comprises filter resistor $R_{FILT}$ and filter capacitor $C_{FILT}$ and comprises an anti-kickback filter configured to attenuate any kick resulting from the switched capacitors of ADC 130.

Referring again to FIG. 2, filtered voltage $V_{FILT}$ is output to third stage 103 comprising ADC 130. ADC 130 may comprise, for example, a successive-approximation register (SAR) ADC. ADC 130 samples the filtered voltage $V_{FILT}$ at sampling frequency $f_S$ to convert the voltage $V_{FILT}$ to a digital output voltage $V_{OUT}$, which may be output to downstream DSP 140. In some examples, the digital output voltage $V_{OUT}$ may comprise a 12-bit digital code signal and sampling frequency $f_S$ may comprise a frequency of about 192 kS/s.

As one skilled in the art will be familiar with, the sampling frequency $f_s$ should be configured to appropriately sample the filtered voltage $V_{FILT}$ to satisfy the Nyquist sampling theorem. In a similar manner, second stage 102 may thus comprise an anti-aliasing filter (AAF) in the form of low-pass filter 122, which is configured to filter out any frequencies that do not satisfy the Nyquist sampling theorem in order to avoid the effects of aliasing in the conversion of ADC 130. Configuration of the sampling frequency $f_s$ and the cut-off frequency of low-pass filter 122 can thus lead to control of the bandwidth of the current sensing circuitry 200.

Circuitry 200 thus provides a current sensing circuit that can sense a current across a sense resistor $R_{SENSE}$ and convert the sensed current to a digital output voltage $V_{OUT}$ for processing. AFE 104 provides an appropriate gain to reduce error and noise contributions of the ADC. In one example, the AFE closed-loop gain is about 20, where the first stage 101 gain is about 10, the second stage gain providing a gain is about 2, although it will be understood that this is just one example and various different implementations are possible. Level-shifting variable resistor $R_0$ coupled to the output of amplifier 110 may be trimmed to tune the high-side gain of the first stage 110 and, as described above, first level-shifting current source $I_{COMP1}$ can provide loop stability for the first stage 101.

First level-shifting current source $I_{COMP1}$ may, however, introduce noise into the processing of the first stage 101. The noise introduced by the first level-shifting current source $I_{COMP1}$ includes offset voltage, flicker noise and random telegraph signal noise (RTS noise).

Furthermore, differential-to-single-ended amplifier 110 may also introduce an offset voltage into circuitry 200, which can drift with temperature and reduce dynamic range.

Figure 3:
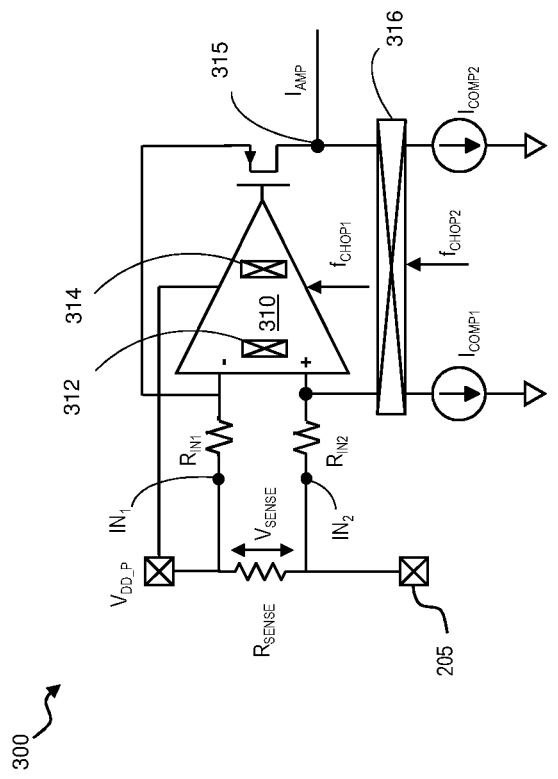
FIG. 3 illustrates a further example of current sensing circuitry.

FIG. 3 illustrates circuitry 300 comprising a chopper amplifier 310. In some examples circuitry 300 may be used as a first stage of current sensing circuitry, such as the first stage 101 of circuitry 100 described above. Chopper amplifier 310 thus further comprises first and second inputs $IN_1$, $IN_2$, configured to sense a load current $I_L$ applied to terminal 205 based on a voltage drop across sense resistor $R_{SENSE}$.

As one skilled in the art will be familiar with, chopper amplifiers, such as amplifier 310, refer to a type of amplifier with a chopping function that can provide desirable qualities, such as, a low offset voltage and low drift.

Chopper amplifiers can be implemented in a number of architectures and topologies. In one example, the input signal is chopped to effectively modulate the input signal in a known way before amplification. The chopping is performed at a defined chopping frequency, which thus modulates the input signal according to the chopping frequency. For a differential input signal, the chopping may be implemented by effectively swapping the differential inputs at the chopping frequency. The modulated input signal is amplified, which can result in any DC offset of the amplifier being applied to the amplified signal. The amplified signal is chopped at the same chopping frequency as the input of the amplifier. This effectively demodulates or removes the modulation applied to the input signal component, but results in a modulation being applied to the offset voltage at the chopping frequency.

The amplified input signal carrying the modulated offset voltage of the amplifier may then be output to a low-pass filter. The filter is configured to pass the amplified input signal and attenuate the modulated offset at the chopping frequency. The combination of the chopper amplifier and the low-pass filter can thus result in an amplifier with a low offset voltage of the order of less than 100 μV.

Referring again to FIG. 3, chopper amplifier 310 comprises an input chopper circuit 312 and an output chopper circuit 314, which together provide the chopping function of amplifier 310. Input chopper circuit 312 and output chopper circuit 314 are chopped according to a first chopping frequency $f_{CHOP1}$ generated by a clock module. Input chopper circuit 312 and output chopper circuit 314 may comprise a switch network of one or more switches, which may comprise MOSFETs. The input chopper circuit 312 and output chopper circuit 314 may thus be operable to switch amplifier 310 between first and second configurations or phases in order to provide the modulation and demodulation described above. The switching between the first and second configurations or phases may thus be controlled at first chopping frequency $f_{CHOP1}$ defined by a suitable clock signal.

Amplifier 310 thus measures the voltage $V_{SENSE}$ across sense resistor $R_{SENSE}$ and outputs current sense signal $I_{AMP}$, representative of a load current $I_L$ applied to terminal 205. As described above in relation to FIG. 1, amplifier circuitry 110 is configured to output an amplifier output signal $S_{AMP}$, which may comprise a current or a voltage. In examples in which amplifier circuitry 110 comprises amplifier 310, the amplifier output signal $S_{AMP}$ may therefore comprise current sense signal $I_{AMP}$. Current sense signal $I_{AMP}$ is thus amplified and processed based on the chopping of input chopper circuit 312 and an output chopper circuit 314. Current sense signal $I_{AMP}$ may therefore be output to a low-pass filter, such as low-pass filter 122 of circuitry 200, in order to remove the offset voltage of amplifier 310.

Referring again to FIG. 3, circuitry 300 further comprises first level-shifting current source $I_{COMP1}$ and second level-shifting current source $I_{COMP2}$. As described above, level-shifting may be provided at the input of an amplifier, such as amplifier 310, in order to provide the appropriate level-shifting of the input signal for amplification and to provide loop stability for amplifier 310. Second level-shifting current source $I_{COMP2}$ may also be provided at the output of amplifier 310.

Second level-shifting current source $I_{COMP2}$ may be matched to the magnitude and polarity of first level-shifting current source $I_{COMP1}$, such that, $I_{COMP1}=I_{COMP2}$ and thus generate an equal defined current. In this way noise and/or offset, such as due to temperature drift, present due to first level-shifting current source $I_{COMP1}$ may be mitigated or cancelled by similar effects resulting from second level-shifting current source $I_{COMP2}$. As discussed above, there may be an offset associated with the first level-shifting current source at the input that can drift with temperature. The second level-shifting current source will drift in the same way such that there is noise correlation between first level-shifting current source $I_{COMP1}$ and second level-shifting current source $I_{COMP2}$. In some examples, first level-shifting current source $I_{COMP1}$ and second level-shifting current source $I_{COMP2}$ may be derived from a common reference current source, such that, both current sources may exhibit the same noise effects and further any variation at the common reference current source may be expressed at both the first level-shifting current source $I_{COMP1}$ and second level-shifting current source $I_{COMP2}$.

Circuitry 300 further comprises current source chopper circuit 316 configured to provide chopping of first level-shifting current source $I_{COMP1}$ and second level-shifting current source $I_{COMP2}$. In use, current source chopper circuit 316 is configured to alternate the connection of first level-shifting current source $I_{COMP1}$ and second level-shifting current source $I_{COMP2}$ between an input (in this case the non-inverting input $IN_2$) and output 315 of chopper amplifier 310. In a first phase of the current source chopper circuit 316, first level-shifting current source $I_{COMP1}$ is connected to the non-inverting input $IN_2$ and second level-shifting current source $I_{COMP2}$ is connected to the output 315. In a second phase, first level-shifting current source $I_{COMP1}$ is connected to the output 315 and second level-shifting current source $I_{COMP2}$ is connected to the non-inverting input $IN_2$. Therefore, current source chopper circuit 316 may comprise one or more switches, which may comprise MOS-FETs and may be configured in a switch network, to switch first and second level-shifting current sources $I_{COMP1}$, $I_{COMP2}$ between the first and second phases of operation. Current source chopper circuit 316 thus is further configured to operate at a second chopping frequency $f_{CHOP2}$, to control the frequency with which first and second level-shifting current sources $I_{COMP1}$, $I_{COMP2}$ are switched between the two phases of operation. For example, second chopping frequency $f_{CHOP2}$ may be defined by a suitable clock signal.

As described above, providing second level-shifting current source $I_{COMP2}$ at the output of amplifier 310 can reduce the noise effects introduced by first level-shifting current source $I_{COMP1}$, for example, by reducing the noise associated with drift. However, even if the first and second current sources are nominally matched to the same magnitude and polarity or derived from a common reference current source, there may still exist some offset between the first level-shifting current source $I_{COMP1}$ and second level-shifting current source $I_{COMP2}$ and/or there may be different RTS or flicker noise associated with the different current sources.

Current source chopper circuit 316 can thus reduce the effects of offset noise introduced to circuitry 300 by first level-shifting current source $I_{COMP1}$ and second level-shifting current source $I_{COMP2}$. The switching of current source chopper circuit 316 between the first and second phases described above results in the offset between the first level-shifting current source $I_{COMP1}$ and the second level-shifting current source $I_{COMP2}$ being modulated according to the second chopping frequency $f_{CHOP2}$. The modulated offset between the first and second level-shifting current sources $I_{COMP1}$, $I_{COMP2}$, can then be removed from the current sense signal $I_{AMP}$ output from amplifier 310, by downstream filter circuitry. In some examples filter circuitry, such as low-pass filter 122 of circuitry 200, may provide at least partial removal of the modulated offset. In some examples, digital filter circuitry downstream of amplifier 310, such as digital filter circuitry of DSP 140 described above with reference to FIG. 2, may provide removal of the modulated offset.

Amplifier 310 may output current sense signal $I_{AMP}$ to low-pass filter circuitry with a cut-off frequency less than the first chopping frequency $f_{CHOP1}$ and the second chopping frequency $f_{CHOP2}$. The cut-off frequency being less than first chopping frequency $f_{CHOP1}$ and the second chopping frequency $f_{CHOP2}$ may enable the amplifier offset, modulated at first chopping frequency $f_{CHOP1}$, and the current offset between first and second level-shifting current sources $I_{COMP1}$, $I_{COMP2}$, modulated at second chopping frequency $f_{CHOP2}$, to be removed from the current sense signal $I_{AMP}$.

In addition, by swapping the first and second level-shifting current sources between the input and the output of the amplifier 310, any RTS or flicker noise from each of the current sources will appear at both the input and the output. Thus noise at the input and the output is correlated, which means that the noise is at least partly cancelled.

Current source chopping circuit 316 thus correlates the noise resulting from first and second level-shifting current sources $I_{COMP1}$, $I_{COMP2}$, between the input and the output of amplifier 310, which can thus remove noise effects associated with either current source, $I_{COMP1}$, $I_{COMP2}$ such as due to offset RTS noise and/or flicker noise.

In some examples, the first chopping frequency $f_{CHOP1}$ for controlling chopping of amplifier 310 and the second chopping frequency $f_{CHOP2}$ for controlling chopping of current source chopper circuit 316 may thus be the same frequency, such that $f_{CHOP1}=f_{CHOP2}$. In this way, first chopping frequency $f_{CHOP1}$ and the second chopping frequency $f_{CHOP2}$ may be derived from the same clock signal. For example, first chopping frequency $f_{CHOP1}$ and second chopping frequency $f_{CHOP2}$ may be dictated synchronously by a master clock, but may be some fixed delay apart, for example, 40 ns and may thus be different phases of the same clock signal. Furthermore, with $f_{CHOP1}=f_{CHOP2}$, the amplifier offset and the current offset between first and second level-shifting current sources $I_{COMP1}$, $I_{COMP2}$ may be filtered from current sense signal $I_{AMP}$ at the same frequency, which may lead to reduced complexity of the downstream filter circuitry.

The chopping provided by input chopper circuit 312, output chopper circuit 314 and current source chopper circuit 316 may thus reduce the noise effects associated with amplifier offset and the current offset between first and second level-shifting current sources $I_{COMP1}$, $I_{COMP2}$. However, the switching caused by input chopper circuit 312, output chopper circuit 314 and current source chopper circuit 316 may also introduce noise, such as switching transients into circuitry 300. Thus, downstream filter circuitry, may also be configured to filter any noise introduced by the switching of input chopper circuit 312, output chopper circuit 314 and current source chopper circuit 316. In some examples, first chopping frequency $f_{CHOP1}$ and the second chopping frequency $f_{CHOP2}$ may be different such that $f_{CHOP1} \neq f_{CHOP2}$. For example, second chopping frequency $f_{CHOP2}$ supplied to current source chopper circuit 316 may comprise a lower rate of switching than first chopping frequency $f_{CHOP1}$ supplied to input chopper circuit 312 and output chopper circuit 314 of amplifier 310. A lower rate of switching of one of first chopping frequency $f_{CHOP1}$ and the second chopping frequency $f_{CHOP2}$ may reduce the noise introduced to the circuit 300 due to transients and may further provide for power savings measures. However, in examples in which first chopping frequency $f_{CHOP1}$ and the second chopping frequency $f_{CHOP2}$ are different, this may increase the complexity of downstream processing circuitry used to filter any noise present at the first chopping frequency $f_{CHOP1}$ and the second chopping frequency $f_{CHOP2}$.

The description above has illustrated that the combination of current source chopper circuit 316, first and second current sources $I_{COMP1}$, $I_{COMP2}$ and chopper amplifier 310 provide a current sense circuit that can sense a current through sense resistor $R_{SENSE}$ with low offset and low noise. However, it will be appreciated that the noise improvements provided by current source chopper circuit 316 and first and second current sources $I_{COMP1}$, $I_{COMP2}$ may be applied to other amplifier circuitry, such as amplifier 110, that does not comprise a chopping function.

Figure 4:
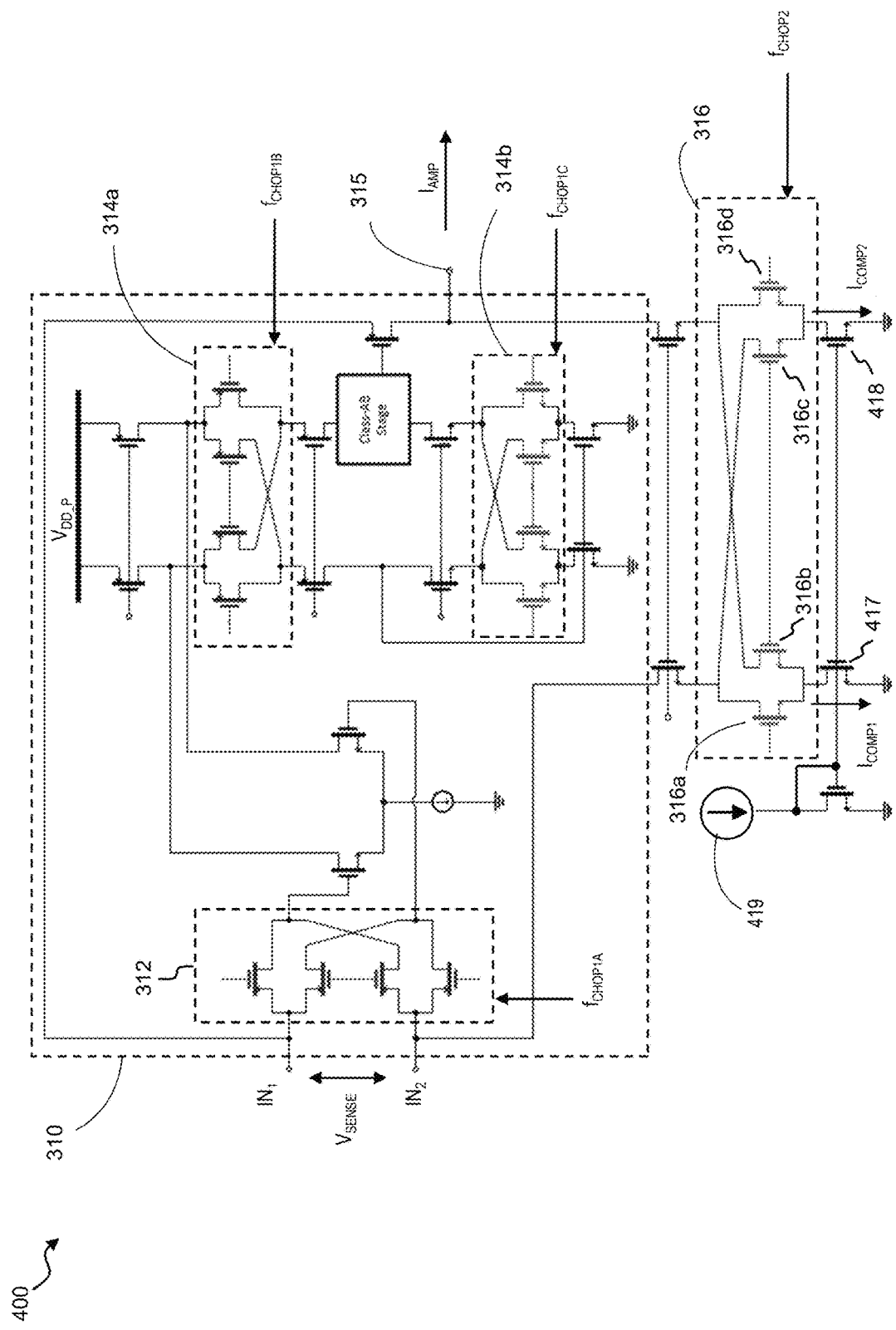
FIG. 4 illustrates another example of current sensing circuitry.

FIG. 4 illustrates circuitry 400 according to an embodiment which illustrates one example of the circuitry 300 of FIG. 3 in more detail and in which elements in common with circuitry 300 are denoted by common reference numerals.

As noted, circuitry 400 illustrates an example of how the elements of circuitry 300 may be realised. Circuitry 400 thus comprises differential chopper amplifier 310 configured to measure the voltage drop $V_{SENSE}$ across a sense resistor e.g. sense resistor $R_{SENSE}$, at first and second inputs $IN_1$, $IN_2$ of amplifier 310. The voltage drop $V_{SENSE}$ may be indicative of a current applied to load $I_L$ and differential amplifier 310 thus further comprise output 315 configured to output current sense signal $I_{AMP}$ representative of load current $I_L$.

Differential chopper amplifier 310 thus further comprises input chopper circuit 312, first output chopper circuit 314a and second output chopper circuit 314b. Input chopper circuit 312 and first output chopper circuit 314a comprise PMOS switches and second output chopper circuit 314b comprises NMOS switches. As described above, input chopper circuit 312, first output chopper circuit 314a and second output chopper circuit 314b may be switched based on a first chopping frequency $f_{CHOP1}$ in order to remove noise associated with amplifier offset. Input chopper circuit 312, first output chopper circuit 314a and second output chopper circuit 314b may therefore each be configured to receive respective representations of first chopping frequency $f_{CHOP1}$ of $f_{CHOP1A}$, $f_{CHOP1B}$ and $f_{CHOP1C}$, i.e. respective clock signals at the same frequency as one another derived from a common master clock signal.

In some examples, the clock signals for the first chopping frequencies $f_{CHOP1A}$, $f_{CHOP1B}$ and $f_{CHOP1C}$ may each be at the same overall first chopping frequency $f_{CHOP1}$ and synchronous with one another, but may have different phase with respect to the first chopping frequency $f_{CHOP1}$. The clock signals of the first chopping frequency $f_{CHOP1A}$, $f_{CHOP1B}$ and $f_{CHOP1C}$ may thus comprise a first chopping frequency signal $f_{CHOP1A}$, a second chopping frequency signal $f_{CHOP1B}$ and a third chopping frequency signal $f_{CHOP1C}$. As one skilled in the art will be familiar with, the signals of the first chopping frequency $f_{CHOP1A-C}$ may be supplied to input chopper circuit 312, first output chopper circuit 314a and second output chopper circuit 314b, respectively, to modulate the amplifier offset at the first chopping frequency $f_{CHOP1}$.

Referring again to FIG. 4, circuitry 400 further comprises current source chopper circuit 316 configured to chop first and second level-shifting current sources $I_{COMP1}$, $I_{COMP2}$ based on second chopping frequency $f_{CHOP2}$, as described above. Current source chopper circuit 316 comprises first to fourth NMOS switches 316a-d. First level-shifting current source $I_{COMP1}$ and second level-shifting current source $I_{COMP2}$ comprise active current sources formed of NMOS transistors 417 and 418, respectively, which are each supplied with a current from common reference current source 419.

Current source chopper circuit 316 may be operable in the first phase described above in which first level-shifting current source $I_{COMP1}$ is connected to the non-inverting input $IN_2$ and second level-shifting current source $I_{COMP2}$ is connected to the output 315, by applying a bias voltage to first NMOS switch 316a and fourth NMOS switch 316d. Current source chopper circuit 316 may then be operable in the second phase, described above, in which, first level-shifting current source $I_{COMP1}$ is connected to the output 315 and second level-shifting current source $I_{COMP2}$ is connected to the non-inverting input $IN_2$ by applying a bias voltage to second NMOS switch 316b and third NMOS switch 316c. The bias voltage applied to first to fourth NMOS switches 316a-d to switch the current source chopper circuit 316 between the two phases is thus controlled based on second chopping frequency $f_{CHOP2}$.

As described above, in some examples the first chopping frequency $f_{CHOP1}$ and second chopping frequency $f_{CHOP2}$ may be the same frequency such that $f_{CHOP1}=f_{CHOP2}$. In such examples, first chopping frequency $f_{CHOP1}$ and second chopping frequency $f_{CHOP2}$ may therefore be dictated by a common master clock. In a similar manner to the first to third chopping frequency signals $f_{CHOP1A-C}$, a clock signal for second chopping frequency $f_{CHOP2}$ may thus comprise an additional signal at the first chopping frequency $f_{CHOP1}$. Thus the clock signals for chopping frequency signals $f_{CHOP1A}$, $f_{CHOP1B}$, $f_{CHOP1C}$ and $f_{CHOP2}$, supplied to input chopper circuit 312, first output chopper circuit 314a, second output chopper circuit 314b and current source chopper circuit 316, respectively, may each comprise separate signals derived from a master clock signal. These clock signals may thus be provided to input chopper circuit 312, first output chopper circuit 314a, second output chopper circuit 314b and current source chopper circuit 316 to modulate the amplifier offset and offset between the first current source $I_{COMP1}$ and second current source $I_{COMP2}$ at a common chopping frequency e.g. first chopping frequency $f_{CHOP1}$. As will be described in more detail below, a common chopping frequency e.g. first chopping frequency $f_{CHOP1}$, used to control the chopping of input chopper circuit 312, first output chopper circuit 314a, second output chopper circuit 314b and current source chopper circuit 316 may be dictated based on a sampling frequency of an ADC downstream of amplifier 310.

Figure 5:
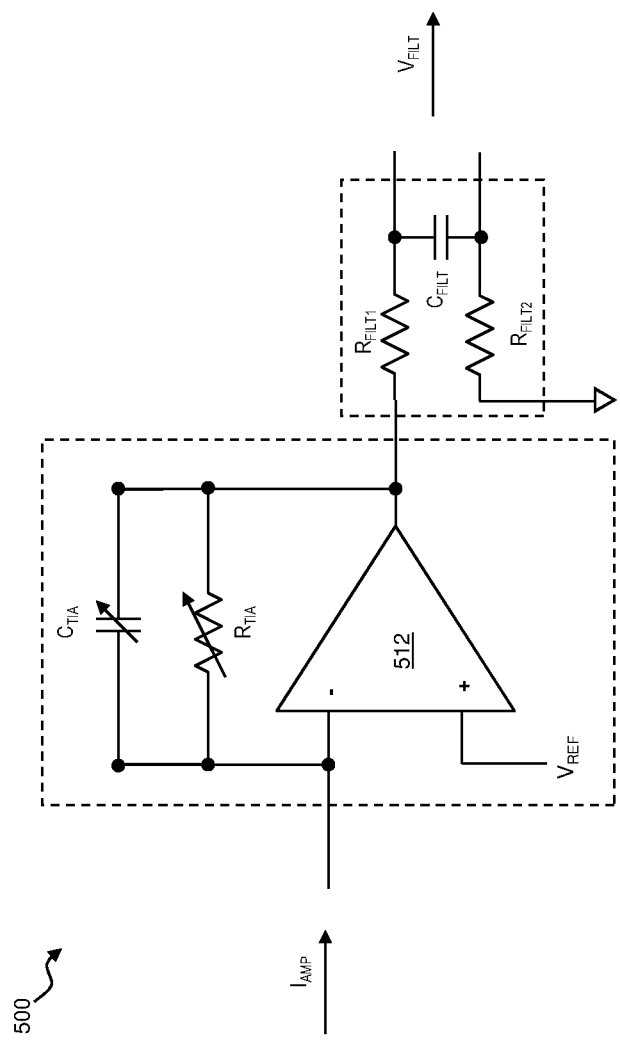
FIG. 5 illustrates an example of an anti-aliasing filter (AAF)

FIG. 5 illustrates circuitry 500 according to an embodiment. Circuitry 500 comprises a low-pass filter and in some examples may thus comprise an anti-aliasing filter, such as the filter provided by the second stage 102 of circuitry 100 described above in relation to FIG. 1. Circuitry 500 may further comprise a current-to-voltage converter configured to receive a current sense signal $I_{AMP}$ from an amplifier, such as amplifier 310, and output a voltage signal $V_{FILT}$.

Circuitry 500 comprises trans-impedance amplifier (TIA) 510 comprising op-amp 512, resistor $R_{TIA}$ and capacitor $C_{TIA}$. Op-amp 512 is configured to receive a reference voltage $V_{REF}$, such as ground, at the non-inverting input and the current sense signal $I_{AMP}$ at the inverting input. As one skilled in the art will be familiar with, a TIA converts the current received at the inverting input into a voltage such that the voltage output by the TIA, $V_{FILT}=V_{REF}-(I_{AMP}*R_{TIA})$. Thus, in examples where current sense signal $I_{AMP}$ is representative of a current through a load $I_L$, the output voltage of the TIA $V_{FILT}$ may thus be representative of said load current $I_L$. TIA 510 may thus provide suitable conversion of current sense signal $I_{AMP}$ into a voltage $V_{FILT}$ for downstream processing. The gain of the TIA thus depends on the resistance $R_{TIA}$ and, as illustrated, the $R_{TIA}$ may be implemented as a variable resistance to allow the gain to be tuned.

The feedback network of the TIA 510, provided by the capacitor $C_{TIA}$ and resistor $R_{TIA}$, also provides some first-order low-pass filtering of current sense signal $I_{AMP}$. As one skilled in the art will be familiar with, the value of capacitor $C_{TIA}$ and resistor $R_{TIA}$ in the feedback network of TIA 510 dictates the bandwidth of the sensing to which TIA 510 is applied according to $f_0=1/(2\pi*R_{TIA}*C_{TIA})$, where $f_0$ is the cut-off frequency of TIA 510. In some examples, as illustrated, the capacitor $C_{TIA}$ may be a variable capacitor, in which case, by controlling both variable capacitor $C_{TIA}$ and variable resistor $R_{TIA}$ the frequencies of current sense signal $I_{AMP}$ amplified by TIA 510 may be controlled.

As described above in relation to FIG. 3, current sense signal $I_{AMP}$ may comprise noise associated with amplifier offset and offset between first and second level-shifting current sources $I_{COMP1}$, $I_{COMP2}$. For example the noise associated with each source of noise may be modulated based on first and second chopping frequencies $f_{CHOP1}$, $f_{CHOP2}$. Variable capacitor $C_{TIA}$ and variable resistor $R_{TIA}$ of TIA 510 may thus be set, such that the cut-off frequency $f_0$ of TIA 510 at least partially filters the noise at the first and second chopping frequencies $f_{CHOP1}$, $f_{CHOP2}$ from current sense signal $I_{AMP}$, with any remaining noise at the first and second chopping frequencies $f_{CHOP1}$, $f_{CHOP2}$ may be removed by a downstream digital filter. Variable capacitor $C_{TIA}$ and variable resistor $R_{TIA}$ of TIA 510 may also be set to provide anti-aliasing filtering of the current sense signal $I_{AMP}$.

In some examples, the anti-aliasing filter functionality of the TIA 510 may therefore be employed in current sensing circuitry downstream of an amplifier configured to sense a current through a resistor, such as amplifier 110 described above in relation to FIG. 2. Circuitry 500 may thus comprise a second stage 102 of circuitry 200. In such examples, the variable resistor $R_O$ at the output of amplifier 110 may be removed from circuitry 200, as the current-to-voltage conversion provided by variable resistor $R_O$ may instead be provided by TIA 510. Thus, implementing circuitry 500 at second stage 102 of circuitry 200 may allow for the removal of variable resistor $R_O$ from the output of amplifier 110, which may thus result in first stage 101 occupying a smaller footprint.

Circuitry 500 further comprises RC filter 520 comprising filter resistors $R_{FILT1}$, $R_{FILT2}$ and filter capacitor $C_{FILT}$. RC filter 520 provides further low-pass filtering of the voltage output by TIA 510 and may filter noise artefacts introduced into voltage $V_{TIA}$ due to the amplification of TIA 510.

In some examples, the filtered voltage $V_{AAF}$ passed by RC filter 510 may be output to an ADC, such as, successive-approximation register (SAR) ADC 130, described above with reference to FIG. 2. RC filter 520 may therefore also comprise an anti-kickback filter configured to attenuate any kick resulting from the switched capacitors at the SAR ADCs input. The values of filter resistors $R_{FILT1}$, $R_{FILT2}$ and filter capacitor $C_{FILT}$ may therefore be selected accordingly to attenuate any kickback effects generated by the switched capacitors of the ADC during the settling time of the switched capacitors.

Figure 6:
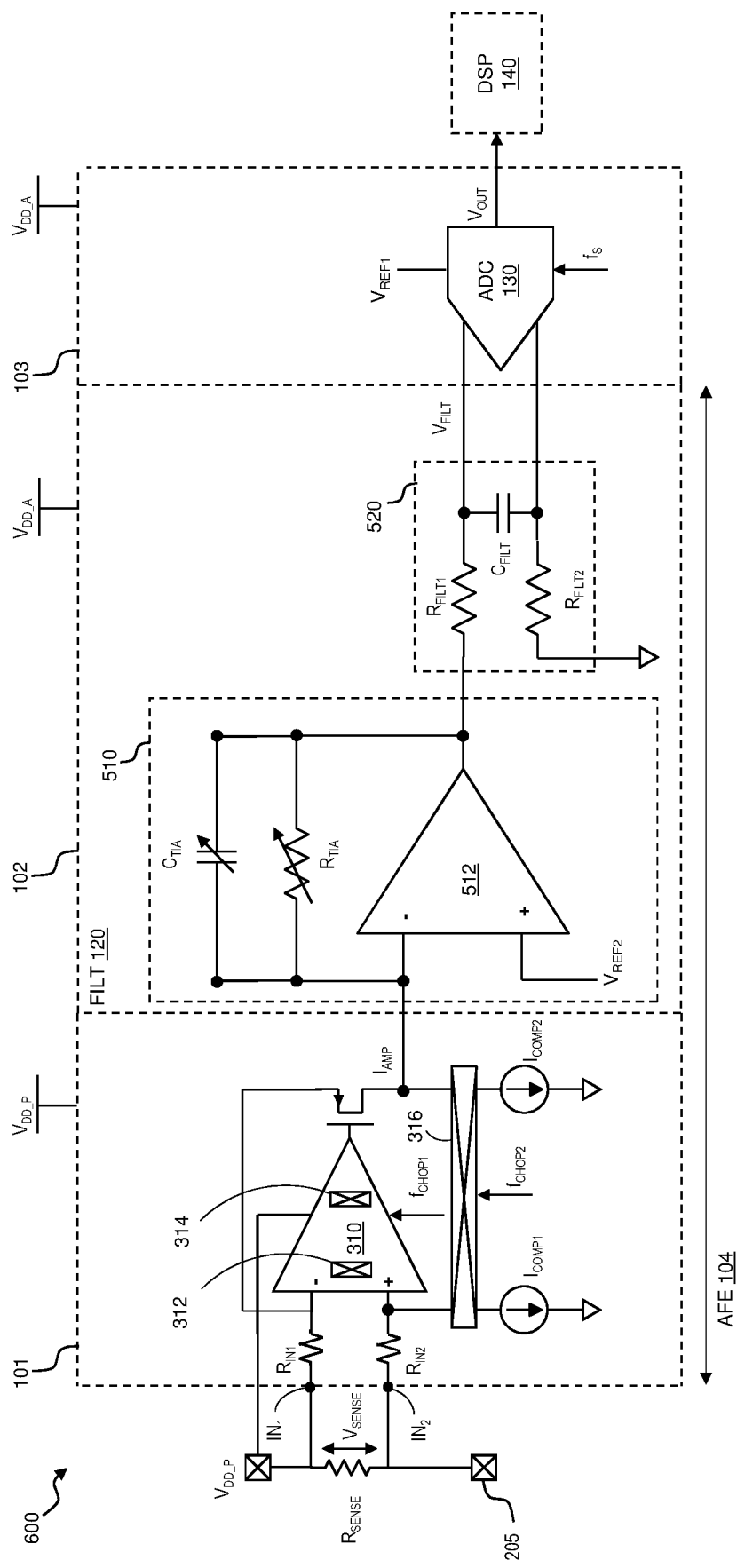
FIG. 6 illustrates another example of current sensing circuitry.

FIG. 6 illustrates circuitry 600 according to an embodiment. Circuitry 600 includes a number of elements in common with circuitry 100-500 described above with reference to FIGS. 1-5, respectively. Such common elements are denoted by common reference numerals and will not be described in detail here, for the sake of clarity and brevity.

Circuitry 600 comprises first stage 101 comprising differential chopper amplifier 310, which is chopped according to a first chopping frequency $f_{CHOP1}$. First stage 101 further comprises first and second current sources $I_{COMP1}$, $I_{COMP2}$ and current source chopper circuit 316 operable between first and second phases according to second chopping frequency $f_{CHOP2}$. First stage 101 may thus be configured to sense load current $I_L$ through sense resistor $R_{SENSE}$ and output current sense signal $I_{AMP}$ representative of load current $I_L$.

Second stage 102 comprises filter circuitry 120 comprising TIA 510 and RC filter 520. As described above, TIA 510 may provide low-pass filtering of current sense signal $I_{AMP}$, to provide anti-aliasing filtering. TIA 510 further provides conversion of current sense signal $I_{AMP}$ to voltage signal $V_{FILT}$ for processing by downstream processing modules. RC filter 520 provides further low-pass filtering of voltage signal $V_{FILT}$ and also comprises an anti-kickback filter for the switch capacitors of ADC 130.

Third stage 103 comprises SAR ADC 130 configured to convert voltage signal $V_{FILT}$ into a digital output voltage signal $V_{OUT}$. Digital output voltage signal $V_{OUT}$ is output to downstream DSP 140 for further processing. As described above, DSP 140 may comprise digital filter circuitry configured to filter out noise modulated at the first chopping frequency $f_{CHOP1}$ and second chopping frequency $f_{CHOP2}$.

SAR ADC 130 is configured to convert the voltage signal $V_{FILT}$ into a digital output voltage signal $V_{OUT}$ according to sampling frequency $f_S$. In some examples, SAR ADC 130 may comprise a finite impulse response (FIR) filter function to filter any ripple introduced by input chopping circuit 312, output chopping circuit 314 and current source chopper circuit 316. In some examples, the FIR filter may comprise a two-point digital moving average filter, which averages out the chopping ripple which may be introduced by input chopping circuit 312, output chopping circuit 314 current source chopper circuit 316. In some examples, the FIR filter of ADC 130 may at least partially filter noise modulated at the first chopping frequency $f_{CHOP1}$ and second chopping frequency $f_{CHOP2}$. In some examples, first and second chopping frequencies $f_{CHOP1}$, $f_{CHOP2}$ may therefore be selected based on the sampling frequency $f_S$. For example the first and second chopping frequencies $f_{CHOP1}$, $f_{CHOP2}$ may be selected to be half the sampling frequency $f_S$ i.e. $f_{CHOP1}=f_{CHOP2}=f_s/2$. This selection may take advantage of the two-point digital moving average filter that is implemented by SAR ADC 130 to remove the noise modulated at the first chopping frequency $f_{CHOP1}$ and second chopping frequency $f_{CHOP2}$ when $f_{CHOP1}=f_{CHOP2}=f_s/2$. In other examples, the first and second chopping frequencies $f_{CHOP1}$, $f_{CHOP2}$ may be selected based on any suitable fraction of the sampling frequency for example $f_s/4$, $f_s/8$ etc. in order to take advantage of the digital moving average filter that is implemented by SAR ADC 130.

Referring again to FIG. 6, SAR ADC 130 is driven by a first reference voltage $V_{REF1}$ and a second reference voltage $V_{REF2}$ is supplied to the non-inverting input of op-amp 512 of TIA 510. In some examples, first reference voltage $V_{REF1}$ and second reference voltage $V_{REF2}$ may each be derived from a common reference voltage source. In some examples, second reference voltage $V_{REF2}$ may be derived from the first reference voltage $V_{REF1}$. For example, second reference voltage $V_{REF2}$ may be derived by applying a factor m to the first reference voltage, such that $V_{REF2}=m*V_{REF1}$, where $m \le 1$. Providing correlation between first reference voltage $V_{REF1}$ and second reference voltage $V_{REF2}$ correlates the common mode reference of TIA 510 and SAR ADC 130. Thus any common mode errors at the TIA 510 that occur due to noise resulting from the second reference voltage $V_{REF2}$ may be accounted for in the conversion of the ADC 130, which is driven by first reference voltage $V_{REF1}$, as first reference voltage $V_{REF1}$ and second reference voltage $V_{REF2}$ may be correlated, as described above. This correlation may thus also mean that op-amp 512 of TIA 510 does not introduce a gain error or power supply rejection ratio (PSRR) error into circuitry 600.

Figure 7A:
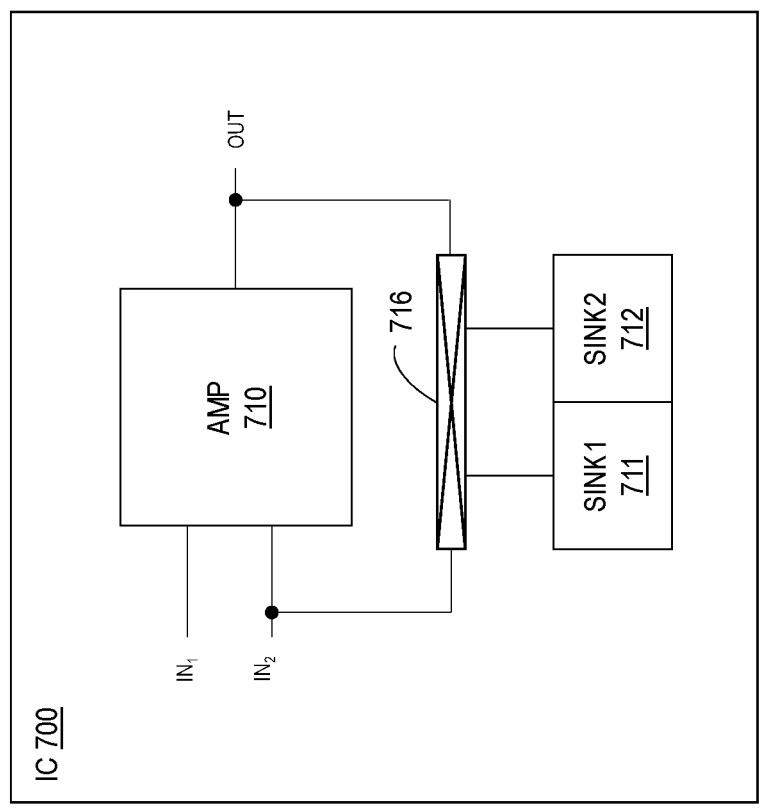
FIGS. 7a-c illustrate examples of an integrated circuit.
Figure 7B:
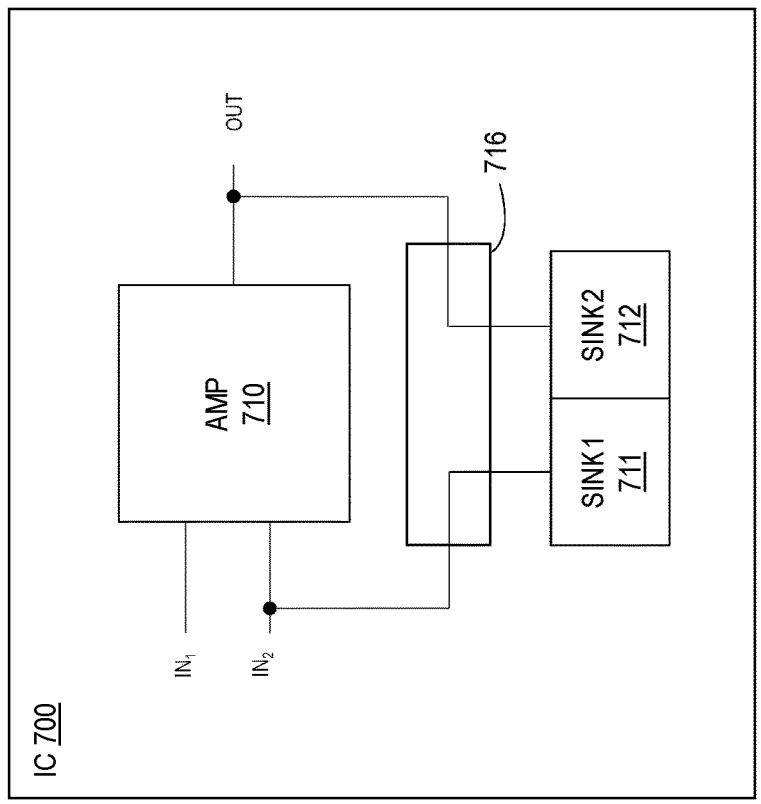
Figure 7C:
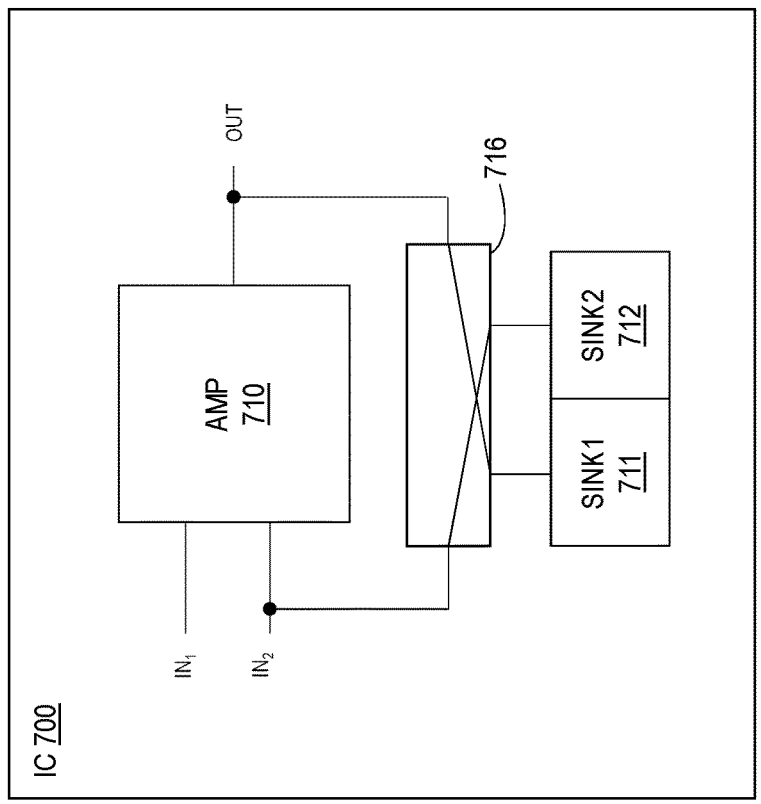

FIGS. 7a-c illustrate an example of an integrated circuit (IC) 700. IC 700 comprises an amplifier 710 that comprises first and second input terminals $IN_1$, $IN_2$, where the amplifier 710 is configured to sense first and second currents into the respective first and second input terminals $IN_1$, $IN_2$ and is further configured to output a sense signal at an output terminal OUT. IC 700 further comprises a first current sink 711 connected to one of the first or second input terminals $IN_1$, $IN_2$ via a switch network 716 and a second current sink 712 connected to the output terminal OUT via the switch network 716. The switch network 716 is configured to repeatedly switch the first current sink 711 between one of the first or second input terminals $IN_1$, $IN_2$ and the output terminal OUT while repeatedly switching the second current source 712 between the output terminal OUT and the one of the first or second input terminals $IN_1$, $IN_2$.

In another example, integrated circuit 700 comprises an amplifier 710 comprising first and second input terminals $IN_1$, $IN_2$, where the amplifier 710 is configured to sense a voltage across the first and second input terminals $IN_1$, $IN_2$ and is configured to output a sense signal at an output terminal OUT. IC 700 further comprises a first current sink 711 connected to one of the first or second input terminals $IN_1$, $IN_2$ via a switch network 716 and a second current sink 712 connected to the output terminal OUT via the switch network 716. The switch network 716 is configured to repeatedly switch the first current sink 711 between one of the first or second input terminals $IN_1$, $IN_2$ and the output terminal OUT while repeatedly switching the second current source 712 between the output terminal OUT and the one of the first or second input terminals $IN_1$, $IN_2$.

FIG. 7b illustrates a first phase of switch network 716 in which the first current sink 711 is connected to the second input terminal $IN_2$ and disconnected from the output terminal OUT, and the second current sink 712 is connected to the output terminal OUT and disconnected from the second input terminal $IN_2$. FIG. 7c illustrates a second phase of switch network 716 in which the first current sink 711 is connected to the output terminal OUT and disconnected from the second input terminal $IN_2$, and the second current sink 712 is connected to the second input terminal $IN_2$ and disconnected from the output terminal OUT. Switch network 716 may thus be operable to repeatedly switch between the first phase and the second phase. In some examples, switch network 716 may be operable to swap connection of the first and second current sinks 711, 712 between the output terminal OUT and the first input terminals $IN_1$, in a similar manner to the first and second phases illustrated with reference to FIGS. 7b and 7c.

In other words, switch network 716 is configured to repeatedly switch a first current sink 711 between one of a first or second input terminals $IN_1$, $IN_2$ of an amplifier 710 and the output terminal OUT of the amplifier 710 while repeatedly switching a second current source 712 between the output terminal OUT of the amplifier 710 and the one of the first or second input terminals $IN_1$, $IN_2$ of the amplifier 710.

Figure 8:
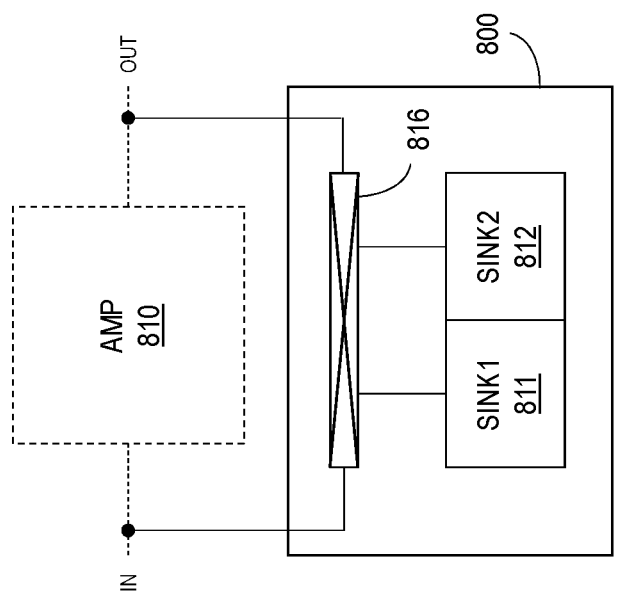
FIG. 8 illustrates an example of chopper stabilised current sink circuitry.

FIG. 8 illustrates chopper stabilised current sink circuitry 800 that comprises first and second current sinks 811, 812 and a switch network 816. The circuitry 800 is configured to repeatedly connect the first current sink 811 between an input terminal IN of an amplifier 810 and an output terminal OUT of the amplifier 810 while repeatedly connecting the second current source 812 between the output terminal OUT of the amplifier 810 and the input terminal IN of the amplifier 810.

Embodiments of the present disclosure provide current sensing circuitry that may sense a current through a sense resistance and output a digital voltage signal representative of the current for processing by downstream processing modules. The current may comprise a current supplied to a load and thus the load current may be controlled depending on the value of the sensed current. Embodiments of the present disclosure also relate to current sensing circuitry comprising a chopped differential amplifier and chopped level-shifting current sources. In combination with a suitable low-pass filter, such as a TIA based low-pass filter, amplifier offset and current offset between the level-shifting current sources can be reduced thereby resulting in current sensing circuitry with low noise performance and low offset drift.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Current sensing circuitry, comprising:
   a differential-to-single-ended amplifier configured to sense a current across a sense resistance and output a measurement current representative of the current across the sense resistance;
   a transimpedance amplifier configured to receive the measurement current sense signal and output a corresponding measurement voltage; and
   an analog-to-digital converter configured to convert the measurement voltage signal to a digital output signal.

2. The current sensing circuitry of claim 1 wherein the differential-to-single-ended amplifier comprises a chopper amplifier configured to operate at a first chopping frequency.

3. The current sensing circuitry of claim 2 further comprising at least one of:
   a first current source configured to generate a defined first bias current; and
   a second current source generate a defined second defined bias current;
   wherein the current sensing circuitry is operable such that the first defined bias current can be provided to a first input of the differential-to-single-ended amplifier and/or the second defined bias current can be provided to an output of the differential-to-single-ended amplifier.

4. The current sensing circuitry of claim 3 comprising said first current source and said second current source and wherein the current sensing circuitry is selectively operable in:
   a first state in which the first defined bias current is provided to the first input of the differential-to-single-ended amplifier and the second defined bias current is provided to the output of the differential-to-single-ended amplifier; and
   a second state in which the first defined bias current is provided to the output of the differential-to-single-ended amplifier and the second defined bias current is provided to the first input of the differential-to-single-ended amplifier; and
   wherein the current sensing circuitry is configured to chop between the first and second states at a second chopping frequency.

5. The current sensing circuitry of claim 4 wherein the second chopping frequency is the same as the first chopping frequency.

6. The current sensing circuitry of claim 4 wherein the first defined bias current and the second defined bias current are equal to one another.

7. The current sensing circuitry of claim 1 wherein the trans-impedance amplifier comprises an anti-aliasing filter.

8. The current sensing circuitry of claim 1 wherein the trans-impedance amplifier is configured to apply first-order low-pass filtering of the measurement current.

9. The current sensing circuitry of claim 8 wherein the trans-impedance amplifier comprises a feedback network configured to apply said first-order low-pass filtering of the measurement current.

10. The current sensing circuitry of claim 8 wherein the differential-to-single-ended amplifier comprises a chopper amplifier configured to operate at a first chopping frequency and wherein the trans-impedance amplifier is configured to apply first-order low-pass filtering of the measurement current with a cut-off frequency lower than said a first chopping frequency.

11. The current sensing circuitry of claim 1 wherein the analog-to-digital converter comprises a successive-approximation register analog-to-digital converter.

12. The current sensing circuitry of claim 11 wherein the successive-approximation register analog-to-digital converter is configured to apply a finite impulse response filter function.

13. The current sensing circuitry of claim 11 wherein the successive-approximation register analog-to-digital converter comprises a two-point digital moving average filter.

14. The current sensing circuitry of claim 13 wherein the differential-to-single-ended amplifier comprises a chopper amplifier configured to operate at a first chopping frequency and wherein the two-point digital moving average filter is configured to apply filtering at the first chopping frequency.

15. Current sensing circuitry, comprising:
a first stage comprising a differential-to-single-ended amplifier configured to sense a current across a sense resistance and to output a corresponding measurement current signal;
a second stage comprising a current-to-voltage converter configured to receive the measurement current signal and output a measurement voltage signal representative of the current across the sense resistance, wherein the current-to-voltage converter is configured to apply first-order low-pass filtering; and
a third stage comprising an analog-to-digital converter configured to convert the voltage signal to a digital output voltage signal.

16. The current sensing circuitry of claim 15 wherein the current-to-voltage converter comprises a transimpedance amplifier.

17. The current sensing circuitry of claim 15 wherein the analog-to-digital converter is configured to apply finite impulse response filtering.

18. The current sensing circuitry of claim 15 wherein the analog-to-digital converter comprises a successive-approximation register analog-to-digital converter.

19. The current sensing circuitry of claim 15 wherein the differential-to-single-ended amplifier comprises a chopper amplifier.

20. The current sensing circuitry of claim 15 further comprising first and second current sources for generating respective first and second bias current and a bias current chopper configured to swap between a first state in which the first bias current is provided to a first input of the differential-to-single-ended amplifier and the second bias current is provided to an output of the differential-to-single-ended amplifier and a second state in which the first bias current is provided to the output of the differential-to-single-ended amplifier and the second bias current is provided to the first input of the differential-to-single-ended amplifier.

* * * * *